United States Patent
Hasegawa et al.

(10) Patent No.: US 7,622,749 B2
(45) Date of Patent: Nov. 24, 2009

(54) SEMICONDUCTOR LIGHT-EMITTING ELEMENT AND METHOD FOR FABRICATING THE SAME

(75) Inventors: Yoshiaki Hasegawa, Katano (JP); Toshiya Yokogawa, Nara (JP); Atsushi Yamada, Osaka (JP)

(73) Assignee: Panasonic Corporation, Kadoma (JP)

(*) Notice: Subject to any disclaimer, the term of this patent is extended or adjusted under 35 U.S.C. 154(b) by 0 days.

(21) Appl. No.: 11/972,844

(22) Filed: Jan. 11, 2008

(65) Prior Publication Data
US 2008/0116479 A1 May 22, 2008

Related U.S. Application Data

(63) Continuation of application No. 10/537,868, filed on Jun. 7, 2005, now Pat. No. 7,396,697.

(51) Int. Cl.
*H01L 29/207* (2006.01)
(52) U.S. Cl. .................. 257/98; 257/99; 257/E33.069; 372/45.013; 372/46.014; 438/22; 438/43
(58) Field of Classification Search .................. 438/22, 438/43; 372/45.013, 46.014; 257/98, 99, 257/E33.069
See application file for complete search history.

(56) References Cited

U.S. PATENT DOCUMENTS

| | | | |
|---|---|---|---|
| 6,348,096 B1 | 2/2002 | Sunakawa et al. | |
| 6,522,676 B1 * | 2/2003 | Goto et al. | 372/43.01 |
| 6,542,531 B2 | 4/2003 | Sirbu et al. | |
| 6,741,623 B2 * | 5/2004 | Ishikawa et al. | 372/45.01 |
| 2004/0258120 A1 | 12/2004 | Kimura | |

FOREIGN PATENT DOCUMENTS

| | | |
|---|---|---|
| JP | 61-187388 | 8/1986 |
| JP | 05-121839 | 5/1993 |

(Continued)

OTHER PUBLICATIONS

"InGaN Multiquantum-Well-Structure Laser Diodes with GaN-AlGaN Modulation-Doped Strained-Layer Superlattices", Shuji Nakamura, IEEE Journal of Selected Topics in Quantum Electronics, vol. 4, No. 3 May/Jun. 1998, pp. 483-489.
"High-Power AlGaInN Laser Diodes with High Kink Level and Low Relative Intensity Noise", Tsuyoshi Tojyo et al., Japanese Journal of Applied Physicas, vol. 41 (2002, pp. 1829-1833.

(Continued)

*Primary Examiner*—Wael Fahmy
*Assistant Examiner*—John C Ingham
(74) *Attorney, Agent, or Firm*—Renner, Otto, Boisselle & Sklar, LLP

(57) ABSTRACT

A method for fabricating a semiconductor light-emitting element according to the present invention includes the steps of (A) providing a striped masking layer on a first Group III-V compound semiconductor, (B) selectively growing a second Group III-V compound semiconductor over the entire surface of the first Group III-V compound semiconductor except a portion covered with the masking layer, thereby forming a current confining layer that has a striped opening defined by the masking layer, (C) selectively removing the masking layer, and (D) growing a third Group III-V compound semiconductor to cover the surface of the first Group III-V compound semiconductor, which is exposed through the striped opening, and the surface of the current confining layer.

9 Claims, 11 Drawing Sheets

FOREIGN PATENT DOCUMENTS

| | | |
|---|---|---|
| JP | 07-326812 | 12/1995 |
| JP | 08-064791 | 3/1996 |
| JP | 09-148671 | 6/1997 |
| JP | 09-148672 | 6/1997 |
| JP | 10-233547 | 2/1998 |
| JP | 10-0256647 | 9/1998 |
| JP | 2000-286504 A | 10/2000 |
| JP | 2001-068786 | 3/2001 |

OTHER PUBLICATIONS

"Novel Ridge-Type InGaN Multiple-Quantum-Well Laser Diodes Fabricated by Selective Area ReGrowth on n-GaN Substrates" Masaru Kuramoto et al., Japanese Journal of Applied Physics, vol. 40 (2001), pp. L925-L927.

European Search Report for corresponding Application No. 04725998.1, dated Mar. 17, 2006.

* cited by examiner

SEMICONDUCTOR LIGHT-EMITTING ELEMENT AND METHOD FOR FABRICATING THE SAME

This application is a continuation of U.S. patent application Ser. No. 10/537,868 filed on Jun. 7, 2005 now U.S. Pat. No. 7,396,697, which is based on PCT/JP2004/004974 filed on Apr. 6, 2004, which is hereby incorporated herein by reference in its entirety.

TECHNICAL FIELD

The present invention relates to a nitride-based Group III-V compound semiconductor light-emitting element and more particularly relates to a semiconductor light-emitting element, operating in a short wave range of the violet through ultraviolet parts of the spectrum, and a method for fabricating such a light-emitting element.

BACKGROUND ART

To increase the storage capacity of an optical disk, a laser beam for reading and/or writing data from/on it should have a shortened wavelength. Most of DVD players and recorders currently on the market use red semiconductor lasers operating at wavelengths of around 660 nm. A red semiconductor laser like this is fabricated by epitaxially growing an InGaAlP based compound semiconductor on a GaAs wafer, for example.

Recently, people are spending a lot of energy in developing next-generation optical disks that have greater storage capacities than DVDs. A light source for each of those next-generation optical disks needs to constantly radiate a violet laser beam (falling within the wavelength range of around 400 nm), of which the wavelength is even shorter than that of the red ray. A GaN based semiconductor laser, operating at wavelengths of around 400 nm, is one of the most promising light sources for reading from and writing to a Blu-ray Disc™ and other next-generation optical disks. However, the semiconductor laser still has some hurdles to clear to be commercially viable products.

The light-current characteristic curve of a GaN based semiconductor laser should have no kinks in a high optical output range. A kink is observed on the light-current characteristic curve when the laser diode has unstable horizontal transverse mode. That is why a laser structure that can stabilize the horizontal transverse mode should be realized.

Meanwhile, the GaN based semiconductor is not only made up of hard crystals but also chemically stable, and therefore, it is difficult to pattern this material by a wet etching technique. Accordingly, a ridge structure, which is needed to control the horizontal transverse mode, is formed by patterning a GaN based semiconductor layer by a dry etching process. It was reported that a GaN based laser diode with a ridge structure formed by a dry etching process achieved continuous-wave oscillation at room temperature (see IEEE Journal of Selected Topics in Quantum Electronics, Vol. 4 (1998), pp. 483-489 and Japanese Journal of Applied Physics, Vol. 41 (2002), pp. 1829-1833).

However, the fine-line patterning process of a GaN based semiconductor by a dry etching technique is too difficult to control to advance the etching process to a uniform depth within a wafer plane. If the etch depth changed from one location on the wafer to another, then the horizontal transverse mode would not be stabilized among a number of semiconductor lasers that have been cut out from the same wafer. In that case, some elements might have light-current characteristic characteristics with kinks. On top of that, the process reproducibility would decrease not just within the wafer plane but also from one processing lot to another, thus decreasing the production yield of GaN based laser diodes and raising the manufacturing cost instead.

A technique of forming a ridge structure for the GaN based laser diode by selective regrowth was proposed recently (see Japanese Journal of Applied Physics, Vol. 40 (2001), L925 through L927). According to the method proposed in this document, after a number of semiconductor layers have been stacked on an active layer, the wafer is entirely covered with an $SiO_2$ film except a portion to be the ridge structure. Thereafter, the crystal growing process is carried out for the second time, thereby selectively re-growing the semiconductor layers on that portion not covered with the $SiO_2$ film and defining the ridge structure. This method makes it possible to form the ridge structure without patterning the semiconductor layers by a dry etching process. Thus, a manufacturing process with excellent uniformity and reproducibility is provided. In addition, it is also possible to avoid doing any damage on the active layer as a result of the dry etching process.

Nevertheless, according to such a selective regrowth process, it is difficult to avoid depositing a lot of GaN based poly-crystals (poly structure) on the masking $SiO_2$ film. For that reason, if the laser diodes are mounted in a junction-down arrangement to increase the heat dissipation when the optical output of the laser diodes is increased, then the laser diodes will make a less close contact with either a heat sink or a sub-mount, thus causing some inconveniences such as fixing failures.

Besides, since the surface of the crystals is covered with the $SiO_2$ film except the portion to be the ridge structure, the resultant laser diodes have poor heat conduction and heat dissipation and a shorter life.

In order to overcome the problems described above, a primary object of the present invention is to provide a semiconductor light-emitting element that has a novel current confining structure and that does not need any ridge structure for current confining purposes.

Another object of the present invention is to provide a semiconductor light-emitting element that achieves excellent horizontal transverse mode control and heat dissipation, exhibits no kinks even when operated with its optical output increased, and has an extended life.

Yet another object of the present invention is to provide a method for fabricating such a semiconductor light-emitting element at a high yield and a reduced cost.

DISCLOSURE OF INVENTION

A semiconductor light-emitting element according to the present invention includes: a first Group III-V compound semiconductor; a current confining layer, which is made of a second Group III-V compound semiconductor that has grown on a selected surface area of the first Group III-V compound semiconductor and which has a striped opening extending along the length of a resonant cavity; and a third Group III-V compound semiconductor, which covers the surface of the first Group III-V compound semiconductor that is exposed through the striped opening and the surface of the current confining layer.

In one preferred embodiment, the current confining layer has two overhanging portions that overhang toward the striped opening.

In another preferred embodiment, a gap is provided between each of the two overhanging portions and a part of the surface of the first Group III-V compound semiconductor.

In a specific preferred embodiment, the gap has a height of at least 10 nm and a width of at least 0.1 µm.

In another preferred embodiment, a portion of the third Group III-V compound semiconductor, which contacts with the surface of the first Group III-V compound semiconductor through the striped opening, has a width of 0.5 µm to 3 µm.

In another preferred embodiment, the semiconductor light-emitting element of one of claims 1 to 4, wherein the first Group III-V compound semiconductor has a multilayer structure including an active layer.

In another preferred embodiment, the Group III-V compound semiconductors are gallium nitride based.

In another preferred embodiment, the current confining layer includes a gallium nitride layer with aluminum, and has a thickness of 0.1 µm to 0.5 µm.

In another preferred embodiment, the electrical conductivity type of the second Group III-V compound semiconductor is opposite to that of the first Group III-V compound semiconductor.

In another preferred embodiment, the electrical conductivity type of the third Group III-V compound semiconductor is the same as that of the first Group III-V compound semiconductor.

In another preferred embodiment, the electrical conductivity type of the second Group III-V compound semiconductor is n-type.

A method for fabricating a semiconductor light-emitting element according to the present invention includes the steps of: (A) providing a striped masking layer on a first Group III-V compound semiconductor; (B) selectively growing a second Group III-V compound semiconductor over the entire surface of the first Group III-V compound semiconductor except a portion covered with the masking layer, thereby forming a current confining layer that has a striped opening defined by the masking layer; (C) selectively removing the masking layer; and (D) growing a third Group III-V compound semiconductor to cover the surface of the first Group III-V compound semiconductor, which is exposed through the striped opening, and the surface of the current confining layer.

In one preferred embodiment, the step (B) includes growing the second Group III-V compound semiconductor laterally toward the center of the masking layer, thereby defining two overhanging portions for the current confining layer.

In this particular preferred embodiment, the step (C) includes removing parts of the masking layer, which are located under the overhanging portions of the current confining layer, thereby making the overhanging portions overhang toward the center of the striped opening.

In a specific preferred embodiment, the step (D) includes providing gaps between the first Group III-V compound semiconductor and the overhanging portions.

In a specific preferred embodiment, the method includes the steps of: setting the width of the masking layer within the range of 0.5 µm to 3 µm; and setting the width of a portion of the third Group III-V compound semiconductor, which contacts with the surface of the first Group III-V compound semiconductor through the striped opening, to the range of 0.5 µm to 3 µm.

In another preferred embodiment, the first Group III-V compound semiconductor has a multilayer structure including an active layer.

In another preferred embodiment, the Group III-V compound semiconductors are gallium nitride based.

In this particular preferred embodiment, the current confining layer includes a gallium nitride layer with aluminum, and has a thickness of 0.1 µm to 0.5 µm.

BRIEF DESCRIPTION OF DRAWINGS

FIGS. 21(a) through 21(c) illustrate a cross section of a striped opening of the current confining layer 75: wherein FIG. 21(a) illustrates how the cross section looks before a second optical guide layer 72b starts to be deposited; FIG. 21(b) illustrates how the cross section looks while the second optical guide layer 72b is being deposited; and FIG. 21(c) illustrates how the cross section looks when the second optical guide layer 72b is complete.

BEST MODE FOR CARRYING OUT THE INVENTION

Hereinafter, preferred embodiments of the present invention will be described with reference to the accompanying drawings.

Figure 1:
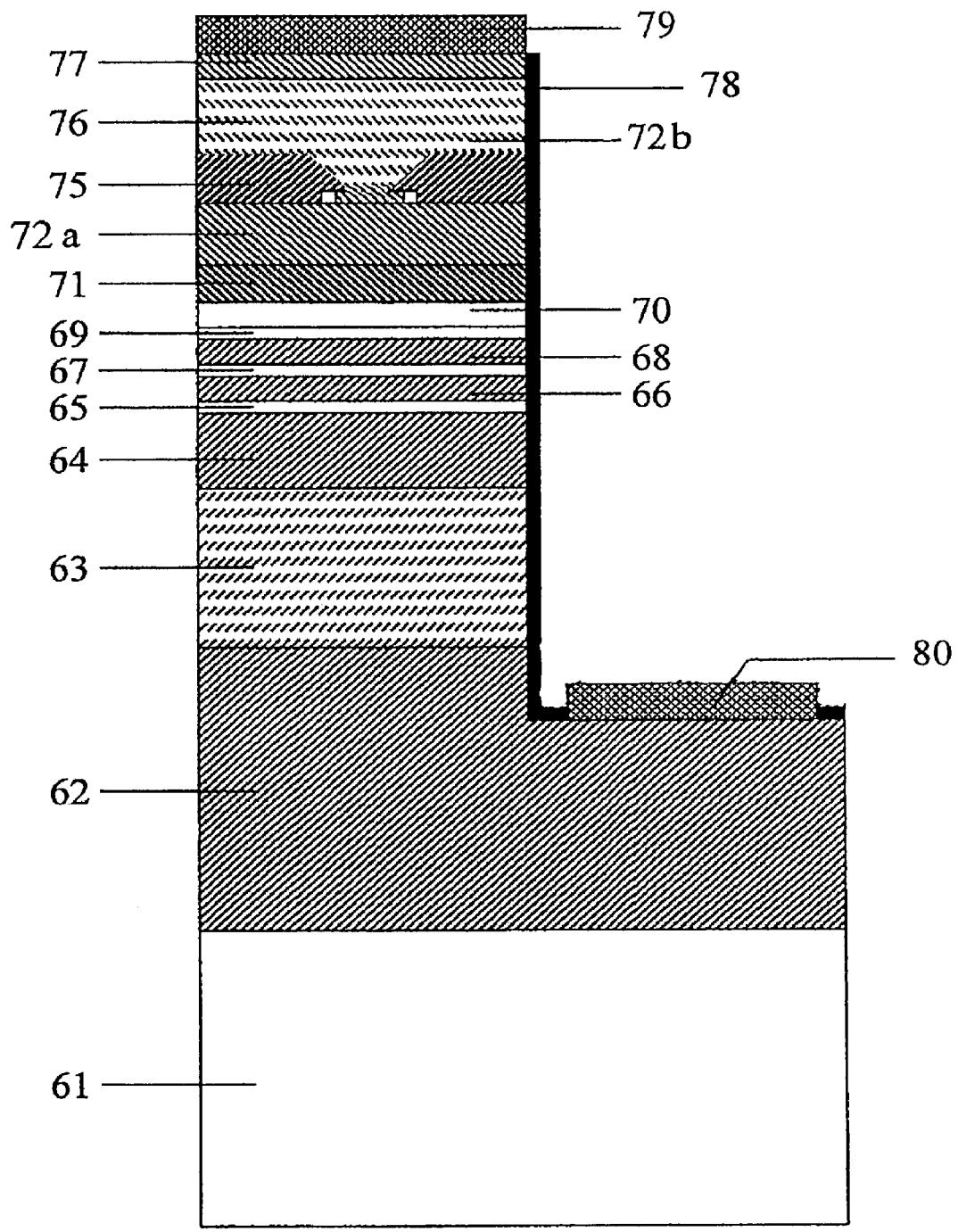
FIG. 1 is a cross-sectional view illustrating the structure of a semiconductor laser according to the present invention.

First, referring to FIG. 1, illustrated is a cross section of a GaN based semiconductor laser according to this preferred embodiment. This semiconductor laser includes a sapphire wafer 61 of which the principal surface is a (0001) plane, a semiconductor multilayer structure provided on the wafer 61 and electrodes 79 and 80. This multilayer structure consists of the layers shown in the following Table 1 and stacked in this order on the wafer 61:

TABLE 1

| Layer | Thickness [nm] | Composition | Dopant: concentration [cm$^{-3}$] |
|---|---|---|---|
| Low temperature buffer layer | About 20 | GaN | |
| Contact layer 62 | About 4000 | n-GaN | Si: About 1 × 10$^{18}$ |
| Cladding layer 63 | About 700 | n-Al$_{0.07}$Ga$_{0.93}$N | Si: 5 × 10$^{17}$ |
| 1$^{st}$ optical guide layer 64 | About 120 | n-GaN | Si: About 1 × 10$^{18}$ |
| Active layer | | | |
| Quantum wells 65, 67, 69 | About 3 | In$_{0.1}$Ga$_{0.9}$N | |
| Barrier layers 66, 68 | About 9 | GaN | |
| Cap layer 70 | About 50 | GaN | |
| Cap layer 71 | About 20 | p-Al$_{0.18}$Ga$_{0.82}$N | Mg: 5 × 10$^{17}$ |

TABLE 1-continued

| Layer | Thickness [nm] | Composition | Dopant: concentration [cm$^{-3}$] |
|---|---|---|---|
| 2$^{nd}$ optical guide layer 72a | About 120 | p-GaN | Mg: 1 × 10$^{18}$ |
| Current confining layer 75 | About 200 | n-Al$_{0.04}$Ga$_{0.96}$N | Si: 5 × 10$^{17}$ |
| 2$^{nd}$ optical guide layer 72b | About 20 | p-GaN | Mg: 1 × 10$^{18}$ |
| Cladding layer 76 | About 700 | p-Al$_{0.07}$Ga$_{0.93}$N | Mg: 5 × 10$^{17}$ |
| Contact layer 77 | About 100 | p-GaN | Mg: 1 × 10$^{18}$ |

The p-electrode 79 is made of nickel (Ni), platinum (Pt) and gold (Au) and provided on the p-type contact layer 77, which is the uppermost layer of the multilayer structure. On the other hand, the n-electrode 80 is made of titanium (Ti) and aluminum (Al) and provided on the n-type contact layer 62. The p- and n-electrodes 79 and 80 are electrically isolated from each other by an insulating film 78 of silicon dioxide (SiO$_2$).

Detailed configurations and functions of these semiconductor layers will be mentioned later when a method for fabricating the semiconductor laser shown in FIG. 1 is described.

Hereinafter, a preferred method for fabricating the semiconductor laser of this preferred embodiment will be described.

First, the layers 62 to 72a shown in FIG. 1 are grown on the wafer 61. More particularly, a sapphire wafer 61, of which the principal surface is a (0001) plane, is prepared and cleaned with an acid solution. Once cleaned, the wafer 61 is held on a susceptor within the reactor of a metalorganic vapor phase epitaxy (MOVPE) system (not shown). Then, the reactor is evacuated.

Subsequently, the reactor is filled with a hydrogen atmosphere with a pressure of 300 Torr and the temperature of the reactor is raised to about 1,100° C., thereby heating the wafer 61 and doing thermal cleaning on the surface of the wafer 61.

Next, the temperature of the reactor is decreased to about 500° C. and then trimethylgallium (TMG) gas (at a flow rate of 7 sccm), ammonia (NH$_3$) gas (at a flow rate of 7.5 slm) and hydrogen gas as a carrier gas are supplied at the same time onto the principal surface of the wafer 61. In this manner, a low-temperature buffer layer of GaN (not shown) is grown to a thickness of about 20 nm.

Subsequently, the temperature of the reactor is raised to about 1,000° C. and silane (SiH$_4$) gas is also supplied as an n-type dopant into the reactor, thereby growing an n-type contact layer 62 of n-GaN with a dopant (Si) concentration of about 1×10$^{18}$ cm$^{-3}$ to a thickness of about 4 μm on the low-temperature buffer layer (not shown).

Next, with trimethylaluminum (TMA) also supplied into the reactor, an n-type cladding layer 63 of n-Al$_{0.07}$Ga$_{0.93}$N with a dopant (Si) concentration of 5×10$^{17}$ cm$^{-3}$ is grown to a thickness of about 0.7 μm on the n-type contact layer 62.

Subsequently, a first optical guide layer 64 of n-GaN with a dopant (Si) concentration of 1×10$^{18}$ cm$^{-3}$ is grown to a thickness of about 120 nm. Thereafter, the temperature of the reactor is decreased to about 800° C. and the carrier gas is changed from hydrogen into nitrogen. In this manner, trimethylindium (TMI) and TMG are supplied, thereby forming a multi-quantum well active layer consisting of In$_{0.1}$Ga$_{0.9}$N quantum wells 65, 66, 69 (with a thickness of about 3 nm each) and GaN barrier layers 66, 68 (with a thickness of about 9 nm each) that have been alternately stacked one upon the other.

Next, to minimize the diffusion of the p-type dopant into the active layer, a cap layer 70 of undoped GaN is grown to a thickness of about 50 nm. After that, the temperature in the reactor is increased to about 1,000° C. again and the carrier gas is switched again from nitrogen into hydrogen. And then with biscyclopentadienyl magnesium (Cp$_2$Mg) gas supplied as a p-type dopant, another cap layer 71 of p-Al$_{0.18}$Ga$_{0.82}$N with a dopant (Mg) concentration of 5×10$^{17}$ cm$^{-3}$ is grown to a thickness of 20 nm.

Thereafter, a second optical guide layer 72a of p-GaN with a dopant (Mg) concentration of 1×10$^{18}$ cm$^{-3}$ is grown to a thickness of about 120 nm.

Up to this point in time, these semiconductor layers have been grown continuously on the (0001) plane of the wafer 61. In other words, none of these semiconductor layers has been etched and patterned. That is why each of these semiconductor layers has a substantially uniform thickness at every location on the wafer 61. And the portion with the n-electrode 80 shown in FIG. 1 has not been defined yet.

Figure 2:
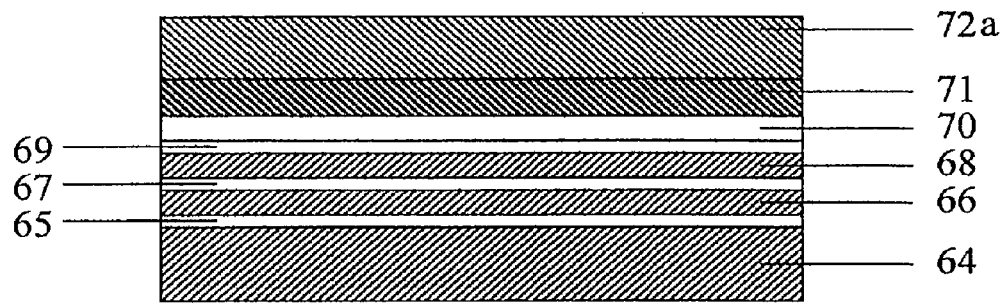
FIGS. 2 through 10 are cross-sectional views illustrating a method for fabricating the semiconductor laser shown in FIG. 1.

Next, referring to FIG. 2, illustrated is only the structure of the n-GaN optical guide layer 64 and other layers that have been grown thereon. It should be noted that the illustration of the wafer 61, n-type contact layer 62 and n-type cladding layer 63 is omitted in FIG. 2 for the sake of simplicity. The same statement will apply to each of FIGS. 3 through 10 to be referred to later.

Figure 3:
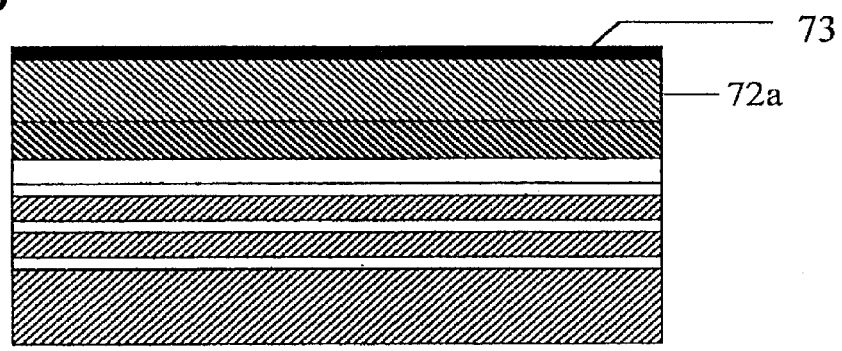

The wafer 61, on which the second optical guide layer 72a has been deposited as its uppermost layer as shown in FIG. 2, is once unloaded from the reactor. Thereafter, an insulating film 73 for selective growth is deposited on the p-GaN layer 72a as shown in FIG. 3. The insulating film 73 may be made of SiO$_2$ that has been deposited using a plasma CVD system and may have a thickness of 10 nm to 200 nm, e.g., about 40 nm.

Figure 4:
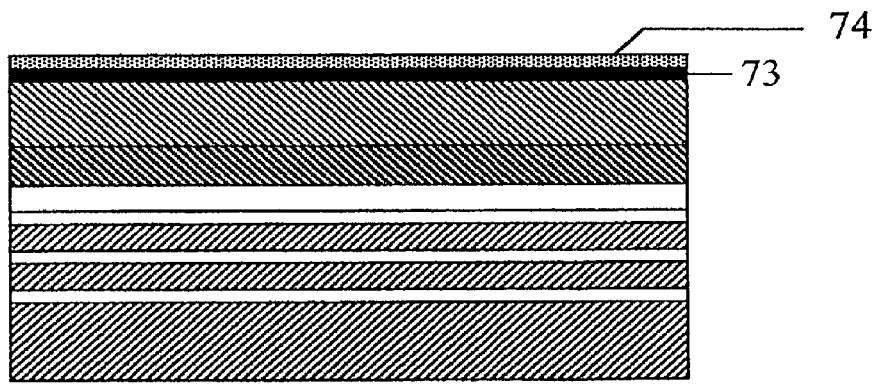
Figure 5:
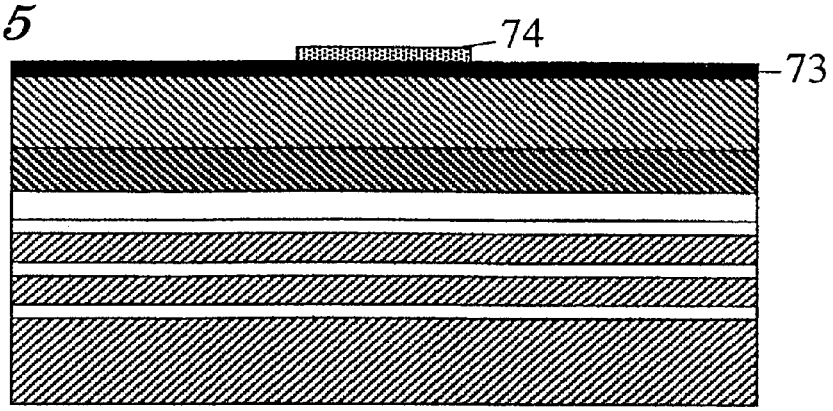

Next, as shown in FIG. 4, a resist film 74 is applied onto the insulating film 73 and then patterned by subjecting it to the exposure and development process steps of a photolithographic process. FIG. 5 shows a cross-sectional shape of the resist film 74 that has been patterned in this manner. The patterned resist film 74 has a striped shape extending in the resonant cavity direction. FIG. 5 illustrates the cross section of just one of a huge number of stripes. The striped pattern of the resist film 74 of this preferred embodiment has a planar layout in which stripes are arranged at a pitch of 200 μm to 1,000 μm, e.g., 500 μm. In this preferred embodiment, each stripe has a width of 3 μm and the resist portions that have been removed from the wafer 61 (i.e., the openings) have a width (i.e., a size measured perpendicularly to the resonant cavity direction) of about 500 μm.

In this preferred embodiment, each striped portion of the patterned resist film 74 extends parallel to the resonant cavity direction (i.e., <1-100> direction of the wafer 61). However, the stripe width does not have to be constant in the resonant cavity direction. For example, the stripe width at an end facet of the resonant cavity may be narrower than elsewhere.

Figure 6:
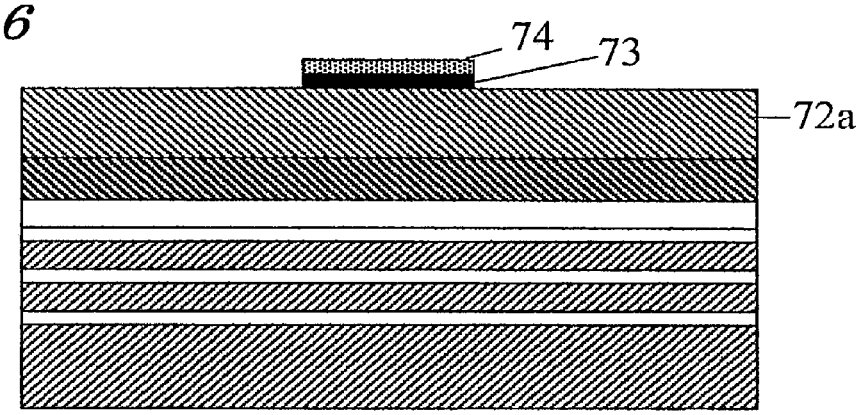
Figure 7:
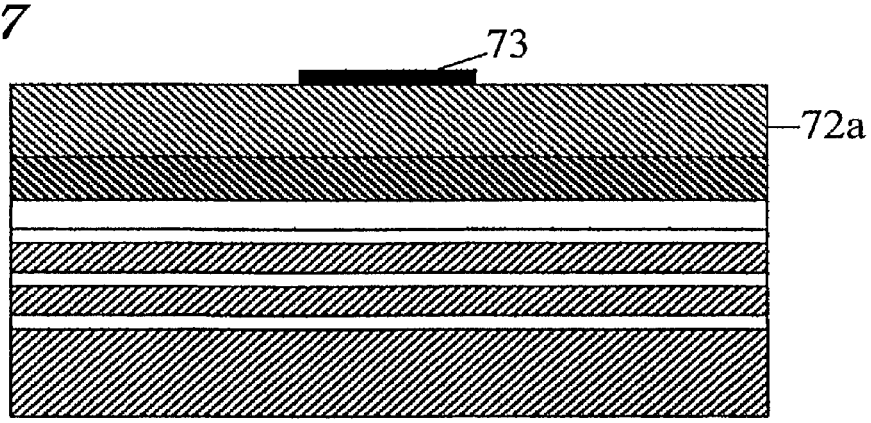

Thereafter, the exposed portions of the insulating film 73, which are not covered with the resist film 74, are removed by a wet etching process using a hydrofluoric acid solution, thereby exposing the upper surface of the p-GaN layer 72a as shown in FIG. 6. Subsequently, the resist film 74 is stripped with an organic solution of acetone, for example, as shown in FIG. 7. The insulating film 73 that has been patterned in this manner will function as a "masking layer" for selective growth.

After that, to selectively grow a semiconductor layer that functions as an n-type current confining layer, the wafer 61, on which the insulating film 73 has been patterned into stripes, is held again on the susceptor within the reactor of the MOVPE system and the reactor is evacuated again. If a semiconductor layer is grown on such a wafer, which has been unloaded once from the reactor and on which a masking layer, for example, is deposited, then such a growth is sometimes called a "regrowth".

Figure 8:
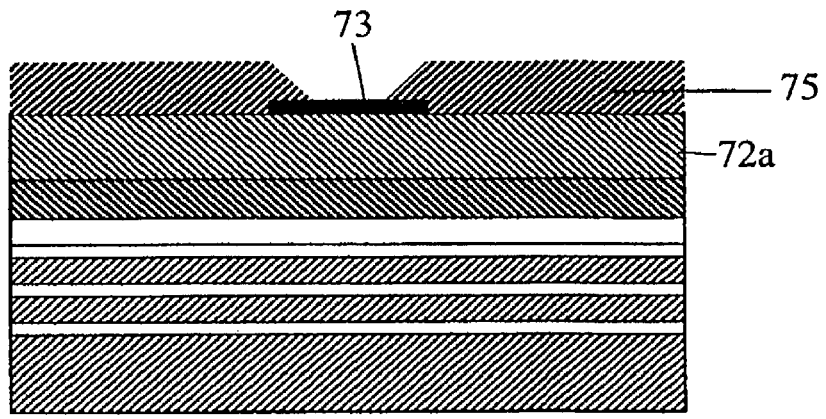

Subsequently, the reactor is filled with a hydrogen atmosphere at a pressure of 200 Torr and the temperature of the reactor is raised to about 1,000° C. In this manner, a current confining layer 75 of n-$Al_{0.04}Ga_{0.96}N$ with a dopant (Si) concentration of $5 \times 10^{17}$ cm$^{-3}$ is grown to a thickness of about 200 nm as shown in FIG. 8.

Under selective growth conditions, the current confining layer 75 does not grow on the insulating film 73 but grows selectively on the exposed surface of the p-GaN layer 72a.

The current confining layer 75 has the function of regulating the injection of holes into the active layer while the semiconductor laser is operating. Thus, holes are injected through the striped areas where there is no current confining layer 75. As a result, the current flow is confined to those narrow areas by the current confining layer 75. The width of the current confined is defined by that of the striped openings of the current confining layer 75. And the width of the striped openings of the current confining layer 75 is controllable with the width of the masking layer for selective growth (i.e., the patterned insulating film 73) and the selective growth conditions.

The current confining layer 75 should have a thickness of at least 100 nm. If the current confining layer 75 were too thin, then holes that have been injected inward from the upper surface of the current confining layer 75 would diffuse downward and current might flow through the current confining layer 75. To minimize such hole injection and diffused current sufficiently, the thickness of the current confining layer 75 is preferably defined approximately equal to or greater than the diffusion length of holes.

Other Group III-V compound semiconductors such as gallium arsenide (GaAs) and indium phosphide (InP) have a hole diffusion length of about 1 μm. Accordingly, a current confining layer, made of any of those alternative Group III-V compound semiconductors, preferably has a thickness of about 1 μm or more.

Meanwhile, in a GaN based semiconductor, holes have a great effective mass and therefore have as short a diffusion length as about 0.2 μm. That is why the current confining layer 75 of AlGaN can have a thickness of 200 nm (=0.2 μm) as in this preferred embodiment. The current confining layer 75 of this preferred embodiment preferably has a thickness of 0.1 μm to 0.5 μm.

It should be noted that when made of gallium arsenide (GaAs) or indium phosphide (InP), the current confining layer 75 should have a thickness of at least about 1 μm. If one tried to form such a thick layer by a selective growth process, then the current confining layer 75 would excessively grow laterally onto the insulating film 73 during the selective growth process. Such a lateral growth is called "epitaxial lateral overgrowth (ELO)". If the ELO growth occurred to an excessive degree, then the current confining layer 75 would cover the insulating film 73 entirely and the striped openings that should be provided to make the current flow could not be shaped appropriately.

Also, during the selective growth, the migration of Ga or Al needs to be accelerated on the surface of the insulating film 73. However, if the selective growth were carried on for a long time, then the migration would become insufficient. As a result, poly-crystals (poly structure) could be easily produced directly on the insulating film 73 in addition to the ELO growth.

In this preferred embodiment, however, the current confining layer 75 is made of AlGaN and its thickness can be reduced to about 200 nm or less, thus overcoming such a problem.

As will be described later, after the current confining layer 75 is formed, a second optical guide layer 72b of p-GaN is grown. In this process step, there is a level difference, corresponding to the thickness of the current confining layer 75, in the striped openings. If this level difference is big, then crystal defects will be easily induced in the second optical guide layer 72b to be grown thereon. However, when a current confining layer 75 with a thickness of 200 nm is used as is done in this preferred embodiment, a p-GaN layer 72b can be re-grown so as to have just a few crystal defects.

To minimize the injection of holes into the active layer appropriately, it is no less important to control the electron density in the current confining layer 75 than to adjust the thickness of the current confining layer 75. Other Group III-V compound semiconductors such as GaAs and InP have a hole diffusion length of about 1 μm. Accordingly, it is necessary to set the electron density (i.e., the concentration of an n-type dopant) relatively high in the current confining layer. Meanwhile, the current confining layer 75 of this preferred embodiment has a short hole diffusion length and therefore can have a low electron density.

The ELO growth of a GaN based semiconductor tends to be suppressed if the concentration of an n-type dopant (e.g., the concentration of Si) to be added to the semiconductor growing is increased. In this preferred embodiment, however, the concentration of the n-type dopant in the current confining layer 75 can be set low, and the ELO growth can be taken advantage of without checking it. If the current confining layer 75 is grown laterally with the ELO growth, then the width of the striped opening will be much narrower than that of the masking layer. For example, it is difficult to define a masking layer (i.e., the insulating film 73) with a stripe width of 2 μm or less constantly by photolithographic and etching processes. According to a preferred embodiment of the present invention, however, by controlling the selective growth conditions of the current confining layer 75 after an insulating film 73 (i.e., masking layer) has been patterned so as to have a relatively broad width, the width of the striped openings can be reduced to as narrow as 2 μm or less.

In this preferred embodiment, the width of the insulating film 73 is set to about 3 μm. Accordingly, the Ga and Al supplied atoms that have landed on the surface of the insulating film 73 can migrate on the insulating film 73 and can easily reach the current confining layer 75 growing, thus contributing to significantly reducing the growth of polycrystals on the insulating film 73. That is why to check the growth of poly-crystals on the insulating film 73, the insulating film 73 preferably has a stripe width of 3 μm or less.

As described above, by controlling the selective growth conditions of the current confining layer 75, the size of the portions of the current confining layer 75 that overhang laterally toward the insulating film 73 can be adjusted to an arbitrary value. In this preferred embodiment, although the insulating film 73 has a stripe width of 3 μm, the width of the striped openings (i.e., the width of the exposed areas of the insulating film 73) is reduced to about 1.5 μm as a result of the ELO growth of the current confining layer 75. Consequently, the current injection area width is defined at about 1.5 μm.

Thus, according to this preferred embodiment, confinement of laser drive current can be controlled appropriately during the operation, and therefore, the horizontal transverse mode of the laser beam emitted can be controlled with high precision, too.

In this preferred embodiment, there is no need to carry out any dry etching process for defining a ridge (i.e., the manufacturing process of this preferred embodiment is "dry-etch-free"), and the overall thickness of the remaining portions of the p-type semiconductors can be controlled just by adjusting the thicknesses of the p-$Al_{0.18}Ga_{0.82}N$ cap layer 71 and p-GaN optical guide layer 72a during the growth processes. Consequently, the horizontal transverse mode can be easily designed and controlled within the wafer plane and without depending on any specific process.

Figure 9:
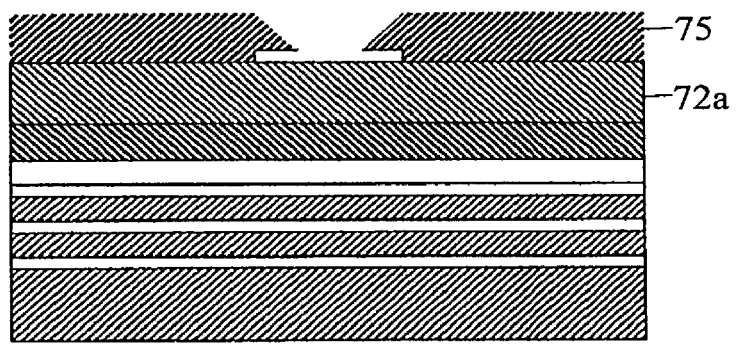

As soon as the current confining layer 75 is complete in this manner, the wafer 61 is once unloaded from the reactor to grow a p-type semiconductor layer over the entire surface of the crystals. Then, the insulating film 73 is selectively removed by a wet etching process using a hydrofluoric acid solution, thereby exposing the p-GaN layer 72a as shown in FIG. 9.

Since the insulating film 73 has been partially covered with the current confining layer 75, gaps are created under the overhanging portions of the current confining layer 75 by removing the insulating film 73.

Figure 21A:
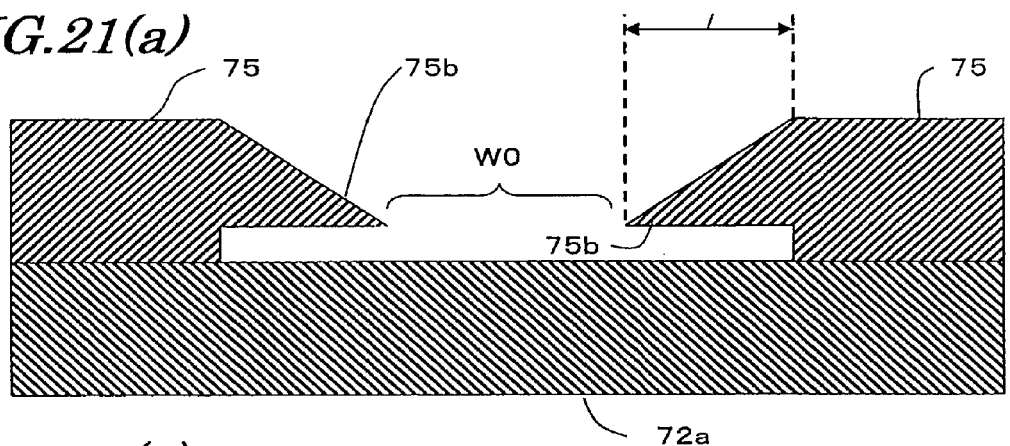

FIG. 21(a) is a cross-sectional view illustrating how the current confining layer 75 looks when the insulating film 73 is removed. Portions 75b of the current confining layer 75, which stick out over the insulating film 73 (i.e., the overhanging portions 75b), have a lateral size W1. There is a gap between the bottom of the overhanging portions 75b and the surface of the second optical guide layer 72a. And the gap is defined by the thickness of the insulating film 73. That is to say, if the insulating film 73 has a thickness of 40 nm, then the gap has a thickness (or height) of 40 nm.

It should be noted that if the insulating film 73 is removed by a highly anisotropic etching process, then parts of the insulating film 73 will remain under the overhanging portions 75b. When such an etching process is carried out, the heat dissipation ability will decrease so much that the laser diode will have a shorter life, which is a problem.

Supposing the gap between the two overhanging portions 75b facing each other is identified by W0, the width of the insulating film 73 is equal to W0+2W1. By controlling the ELO growth, W1 can be adjusted with high precision. Accordingly, the size of W0 can be decreased to a value that is smaller than the feature size of the photolithographic and etching processes with good reproducibility. For example, if the insulating film 73 patterned has a width (=W0+2W1) of 3 μm and if the current confining layer 75 is grown so as to have W1 of 0.75 μm, then the width W0 of the opening will be 1.5 μm (=3 μm−2×0.75 μm). In this case, however, if the patterned insulating film 73 had a width of 1.5 μm, then the gap W0 would become zero and no openings might be provided as intended unless the ELO were controlled. Thus, according to this preferred embodiment, the gap W0 is controlled by taking advantage of the ELO, and therefore, the patterned insulating film 75 preferably has a width (=W0+2W1) of 3 μm or more as described above.

Next, the wafer 61 is held again on the susceptor within the reactor of the MOVPE system and the reactor is evacuated. Subsequently, the reactor is filled with a hydrogen atmosphere at a pressure of 200 Torr and its temperature is raised to about 1,000° C., thereby growing a second optical guide layer 72b of p-GaN with a dopant (Mg) concentration of $1×10^{18}$ $cm^{-3}$ to a thickness of about 20 nm over the entire surface of the wafer 61.

Figure 21B:
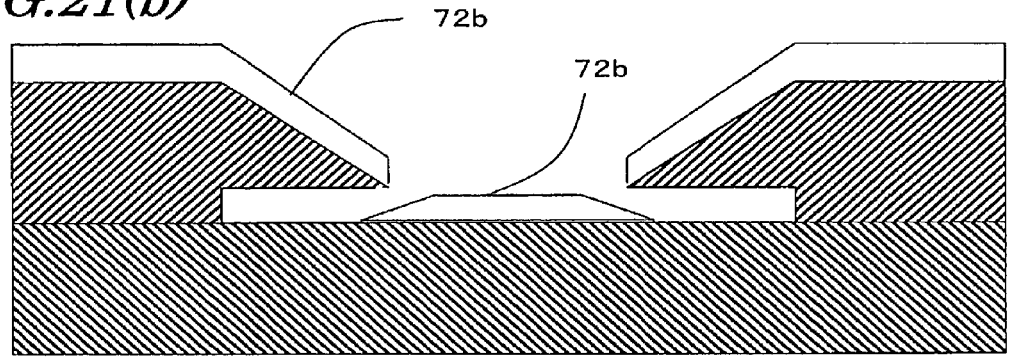
Figure 21C:
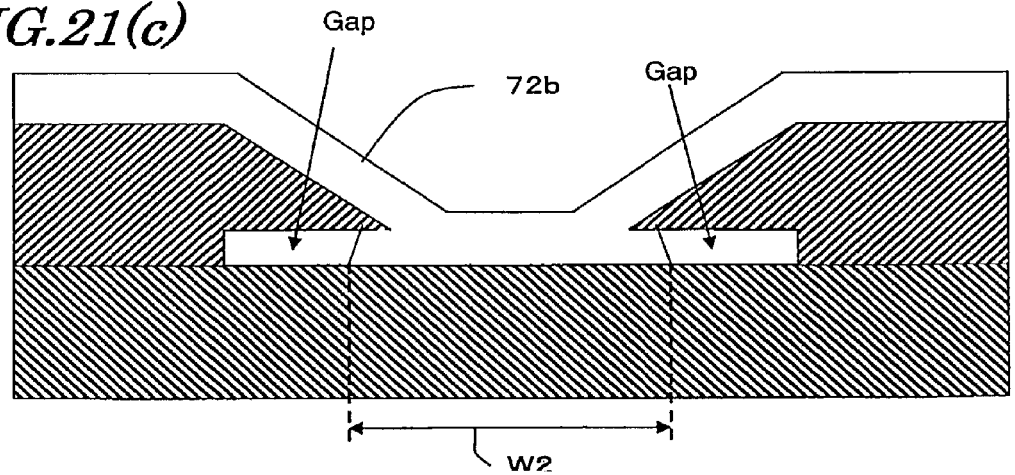

FIGS. 21(b) and 21(c) are cross-sectional views schematically illustrating how the second optical guide layer 72b is growing. In this preferred embodiment, the second optical guide layer 72b has a portion 72b' growing on the surface of the first optical guide layer 72a as shown in FIG. 21(b). However, this portion 72b' will soon combine with the second optical guide layer 72b growing on the current confining layer 75 as shown in FIG. 21(c). When the thickness of the portion 72b' gets approximately equal to that of the gaps under the overhanging portions 75b of the current confining layer 75, the opening with the width W0 is closed with the portion 72b'. Accordingly, the gaps between the overhanging portions 75b and the first optical guide layer 72a are not completely closed with the second optical guide layer 72b. Consequently, some gaps are left between the overhanging portions 75b and the first optical guide layer 72a in the end.

Since these gaps are produced, the width W2 of the contact portion between the first and second optical guide layers 72a and 72b (see FIG. 21(c)) can be smaller than the width of the insulating film 73 in this preferred embodiment. Those gaps have a higher degree of insulating property than the semiconductors and constitute a high barrier to holes that might be injected, thus significantly contributing to confining the current to the narrow area. The gaps may have a width (as measured perpendicularly to the resonant cavity direction) of 0.1 μm to 0.5 μm, for example. The thickness of these gaps may be adjusted according to the thickness of the insulating film 73. However, if the insulating film 73 were too thick, then no gaps could be produced at all. That is why the gaps preferably have a thickness of 0.01 μm to 0.2 μm.

It should be noted that FIGS. 21(a) through 21(c) illustrate a situation where the second optical guide layer 72b is thick enough to fully close the opening of the current confining layer 75 for the sake of simplicity. Actually, however, the second optical guide layer 72b is preferably thin (so as to have a thickness of about 20 nm in this preferred embodiment). In that case, the growth of the second optical guide layer 72b should be finished in the state shown in FIG. 21(b) and then upper semiconductor layers are grown thereon.

Figure 10:
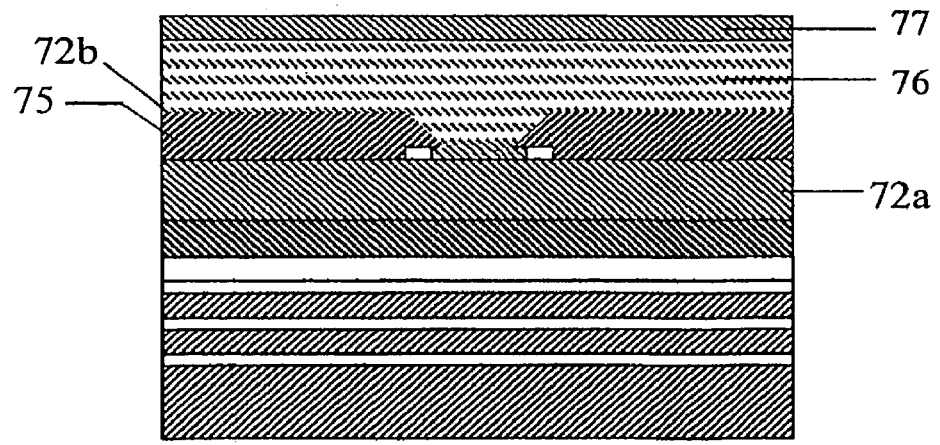

After the second optical guide layer 72b has been deposited in this manner, a p-type cladding layer 76 of p-$Al_{0.07}Ga_{0.93}N$ with a dopant (Mg) concentration of $5×10^{17}$ $cm^{-3}$ is grown to a thickness of about 0.7 μm as shown in FIG. 10. Thereafter, a p-type contact layer 77 of p-GaN with a dopant (Mg) concentration of $1×10^{18}$ $cm^{-3}$ is grown thereon to a thickness of about 0.1 μm. In FIG. 10, no boundary is shown between the second optical guide layer 72b and the p-type cladding layer 76 for the sake of simplicity.

After these crystal-growing processes (or regrowth processes) are over, the p-type semiconductor layers are subjected to an annealing process for the purpose of thermal activation. The wafer is unloaded from the reactor of the MOVPE system and then transported to an annealing furnace so as to be subjected to an annealing process for activating the dopants. Next, the annealing furnace is evacuated, nitrogen gas is supplied at a flow rate of 3 slm, the pressure is increased to the atmospheric pressure, and then the wafer is annealed at 750° C. for 30 minutes. When the annealing process is finished, the wafer is cooled to room temperature and then unloaded from the annealing furnace.

The remaining process will be described with reference to FIG. 1 again.

After the annealing process is over, the wafer is covered entirely with an insulating film of $SiO_2$ except an area in which an n-electrode 80 should be provided. Then, using this insulating film as an etching mask, the exposed portions of the multilayer structure are removed by a dry etching process.

This etching process is carried on until the n-type contact layer 62 is partially exposed. Next, the wafer is entirely covered with an insulating film 78 again except areas where p- and n-electrodes 79 and 80 should be provided. This insulating film 78 is used to electrically isolate the p- and n-electrodes 79 and 80 from each other.

Thereafter, the p- and n-electrodes 79 and 80 are respectively formed by an evaporation process and a lift-off process, for example.

As is clear from the foregoing description, according to this preferred embodiment, no dry etching process should be carried out in order to form a ridge structure for controlling the horizontal transverse mode, and the patterning process of the laser structure can be performed more easily and more simply. As a result, the production yield increases and the cost can be cut down.

Then, the process advances to the step of cleaving the end facet of the laser resonant cavity. First, the back surface of the sapphire wafer 61 is polished, thereby reducing the overall thickness to about 100 μm. After that, the wafer 61 is cleaved with a cleaver (not shown) such that the end facet of the resonant cavity is defined perpendicularly to the ridge stripe direction. At this point in time, a laser bar, which uses the cleaved end facet as a laser resonant cavity (with a resonant cavity length of 750 μm), can be obtained.

Next, the rear end facet of the laser resonant cavity is coated with a high reflectance film. The high reflectance film may have a dielectric multilayer structure consisting of three pairs of $SiO_2$ and $TiO_2$ films.

Finally, the laser bar is subjected to a second cleaving process step, thereby dividing the laser bar into respective laser chips, which are then mounted on laser cans p-side down. In this mounting process step, the laser chips are bonded onto sub-mounts of silicon carbide (SiC) with solder.

Laser Diode Characteristic

A laser diode fabricated by the manufacturing process described above achieved continuous wave oscillation at room temperature, and had a threshold current of 30 mA, a slope efficiency of 1.2 W/A and an oscillation wavelength of 405 nm. Its current-optical output characteristic had a kink level of 100 mW or more.

Figure 18:
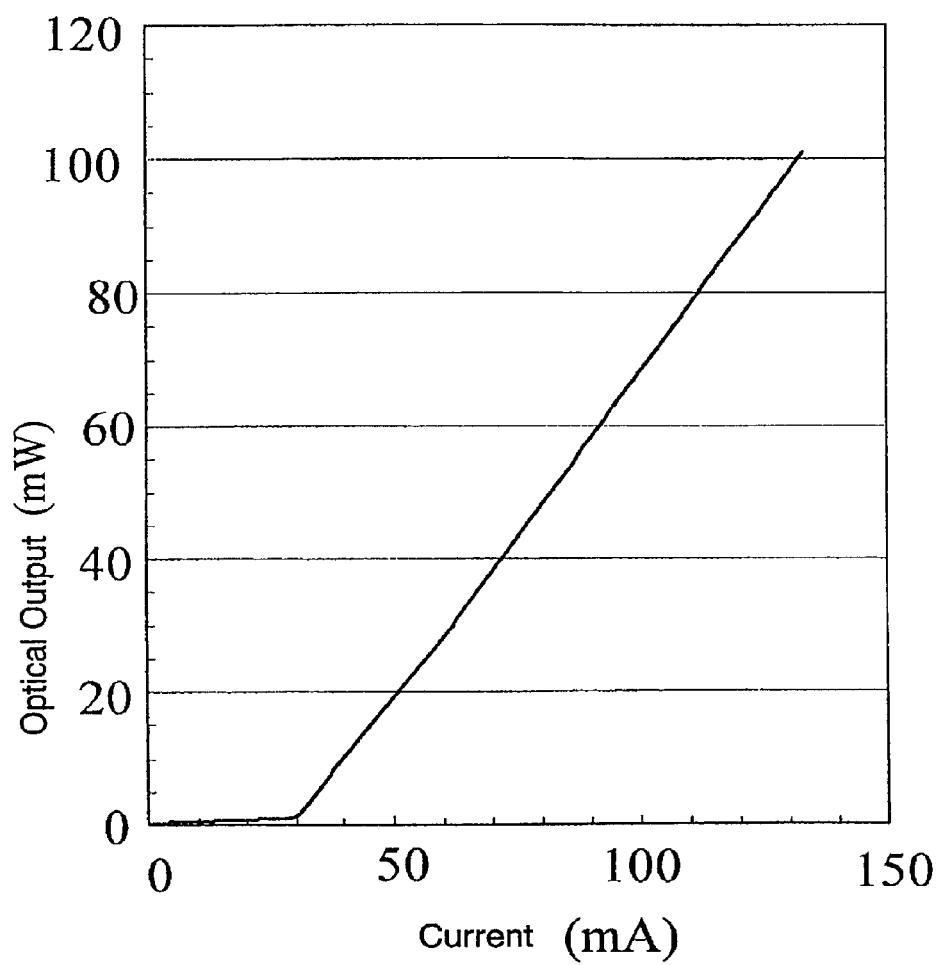
FIG. 18 is a graph showing a current-optical output characteristic in a preferred embodiment of the present invention.

FIG. 18 shows the current-optical output characteristic of the laser diode of this preferred embodiment. It can be seen that the laser diode of this preferred embodiment operates in a stabilized horizontal transverse mode even if its optical output should be as high as about 100 mW. This means that the transverse mode is controlled sufficiently by the current confining layer 75 formed by the selective growth technique.

When its far field pattern (FFP) was evaluated, θ// (parallel to the wafer) was 9 degrees, θ⊥ (perpendicular to the wafer) was 22 degrees, and the aspect ratio (θ⊥/θ//) was 2.4. A semiconductor laser diode for optical disks needs to have an aspect ratio of less than 3. The laser diode of this preferred embodiment meets this requirement.

COMPARATIVE EXAMPLES

Hereinafter, Comparative Examples Nos. 1 to 3 of semiconductor lasers will be described with reference to the accompanying drawings.

Figure 11:
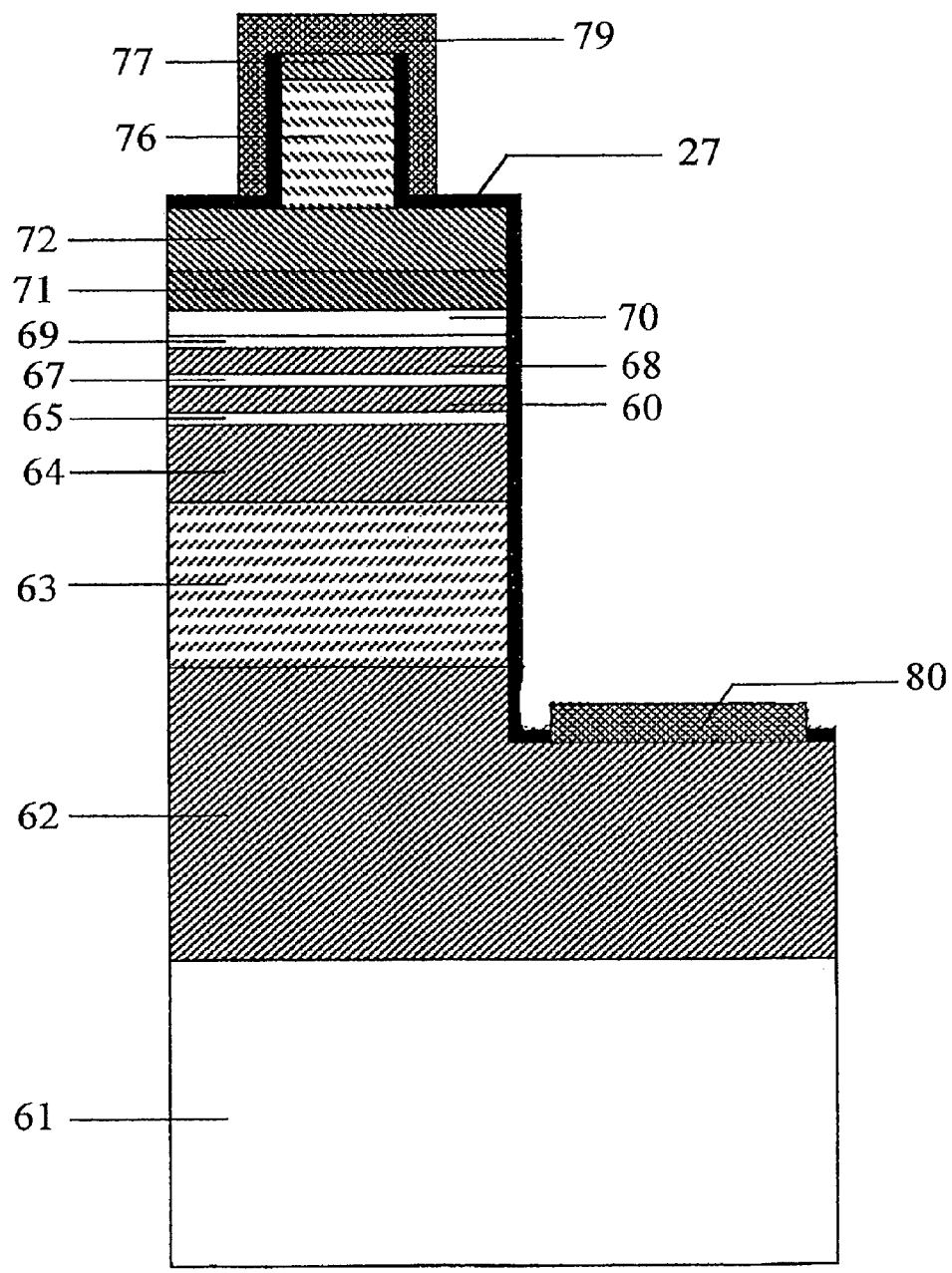
FIG. 11 is a cross-sectional view illustrating the structure of a conventional semiconductor laser (Comparative Example No. 1).

FIG. 11 is a cross-sectional view of a currently most common GaN based laser. Comparing the semiconductor laser shown in FIG. 11 (representing Comparative Example No. 1) to the counterpart shown in FIG. 1 (representing a preferred embodiment of the present invention), it can be seen that both lasers have the same structure from the wafer 61 through the cap layer 71 but are different in the upper multilayer structure on the cap layer 71. That is why the description of this Comparative Example No. 1 will be focused on this upper multilayer structure and a method of making the structure.

The upper multilayer structure of this Comparative Example No. 1 may be formed in the following manner.

First, the multilayer structure is defined on the wafer 61 through the cap layer 71 and then an optical guide layer 72, a p-type cladding layer 76 and a p-type contact layer 77 are grown in this order on the cap layer 71. It should be noted that the illustration of the wafer 61, contact layer 62 and cladding layer 63 is omitted in FIG. 12 for the sake of simplicity. The same statement will apply to each of FIGS. 13 through 17 to be referred to later.

Next, the p-type semiconductor layers are subjected to an annealing process for the purpose of thermal activation. Specifically, the wafer is unloaded from the reactor of the MOVPE system and then transported to an annealing furnace so as to be subjected to an annealing process for activating the p-type dopants. Next, the annealing furnace is evacuated, nitrogen gas is supplied at a flow rate of 3 slm, the pressure is increased to the atmospheric pressure, and then the wafer is annealed at 750° C. for 30 minutes. When the annealing process is finished, the wafer is cooled to room temperature and then unloaded from the annealing furnace.

Figure 12:
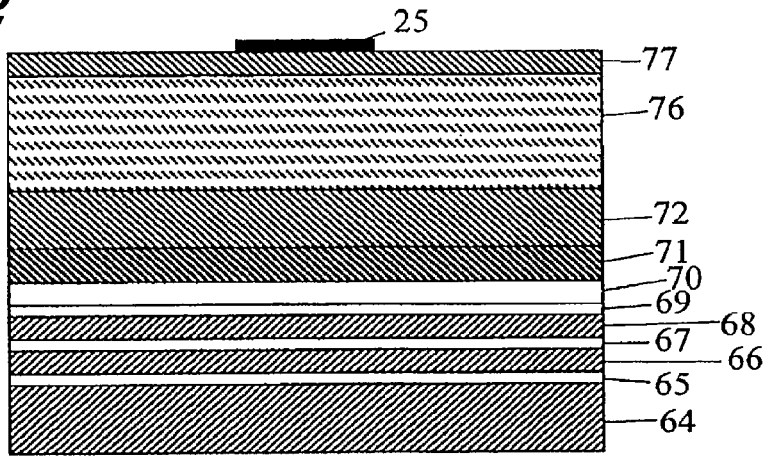
FIGS. 12 through 15 are cross-sectional views illustrating a method for fabricating the semiconductor laser shown in FIG. 11.

Subsequently, as shown in FIG. 12, an $SiO_2$ masking layer 25 is defined on a ridge-reserved area of the p-type contact layer 77. The ridge width may be set to about 2 μm, for example.

Figure 13:
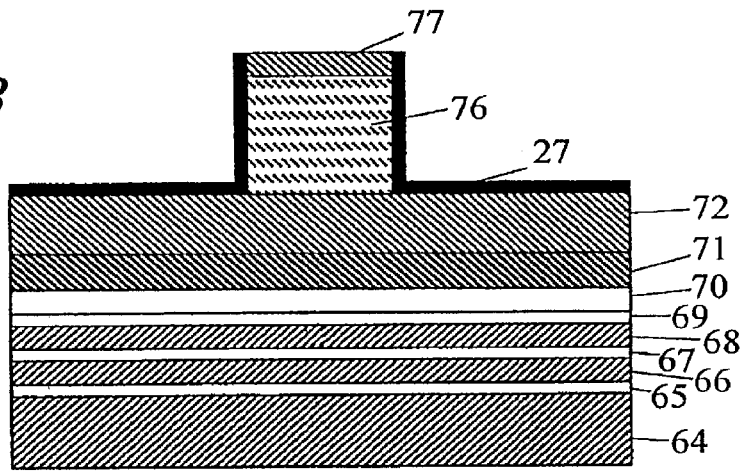
Figure 14:
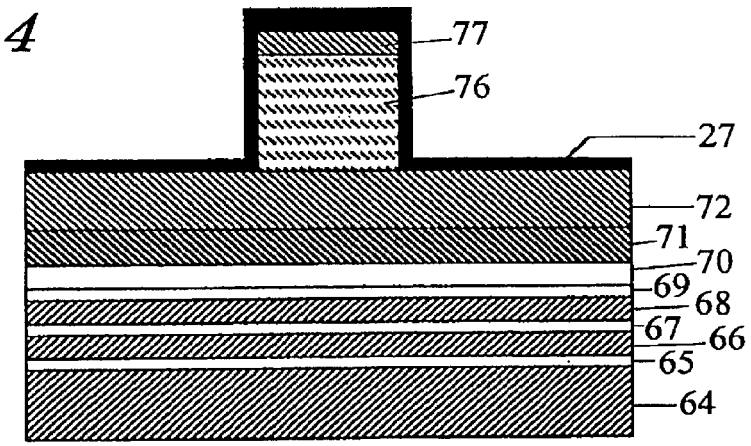

Thereafter, those p-type semiconductor layers are etched with a dry etching system except the ridge-reserved area, thereby setting the overall thickness of the remaining portions of the p-type semiconductor layers on the active layer 69 to about 140 μm as shown in FIG. 13. By forming this ridge structure, the current injected into the GaN based laser can be confined and the horizontal transverse mode can be controlled. After that, the wafer is entirely covered with an insulating film 27 of $SiO_2$ except an area where an n-electrode should be provided.

Subsequently, as shown in FIG. 11, the n-type contact layer 62 is partially exposed by a dry etching process. Then, that surface exposed by the dry etching process is covered with an insulating film of $SiO_2$ again except the area where the n-electrode should be provided.

Figure 15:
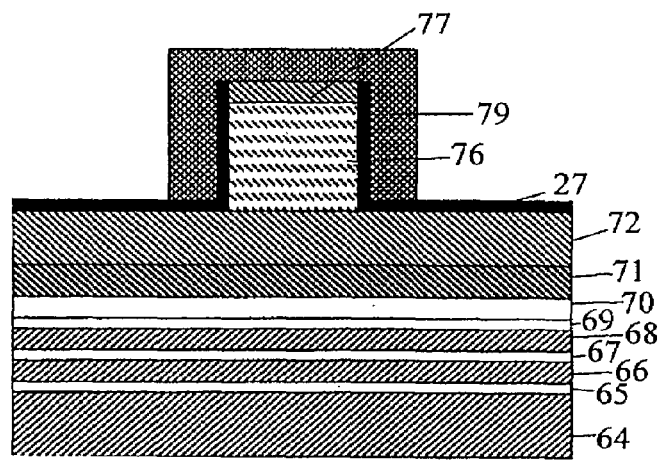

Next, as shown in FIG. 15, after only a portion of the insulating film 27 on the ridge has been removed with a hydrofluoric acid solution, Ni, Pt and Au are evaporated and deposited so as to define a p-electrode 79. Thereafter, Ti and Al are evaporated and deposited so as to define the n-electrode 80. After that, the same process steps as those of the preferred embodiment described above are carried out to obtain Comparative Example No. 1.

Figure 19:
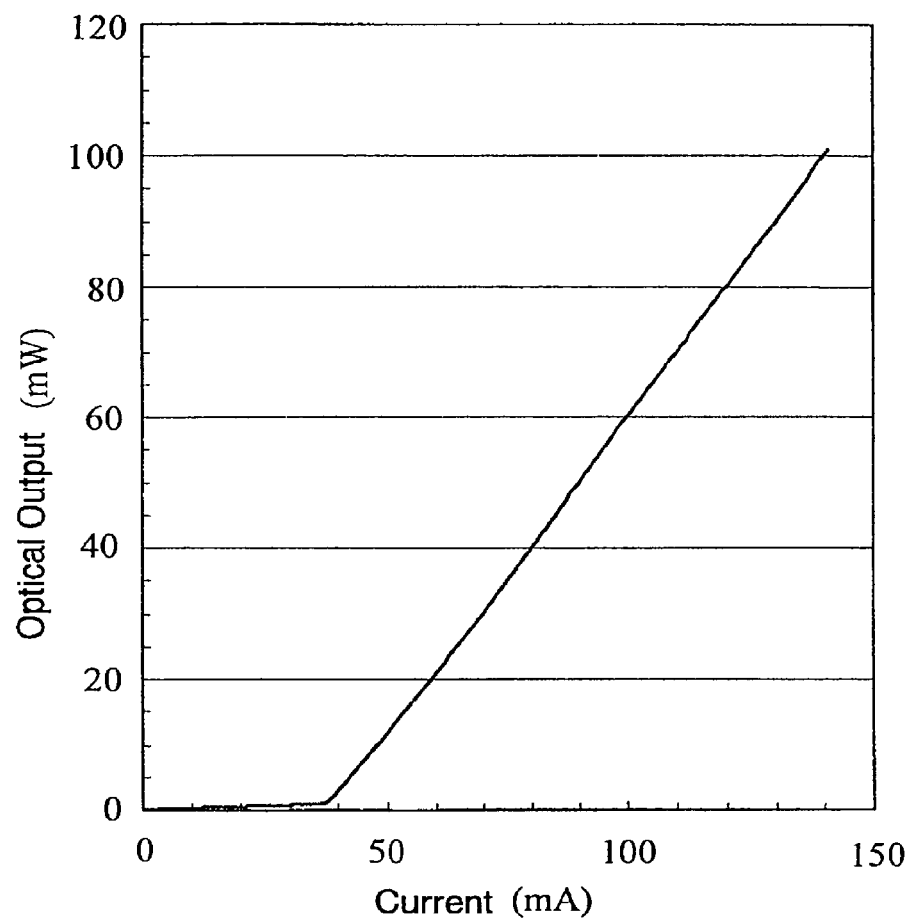
FIG. 19 is a graph showing a current-optical output characteristic in Comparative Example No. 1.

Comparative Example No. 1 fabricated in this manner achieved continuous wave oscillation at room temperature when current was injected thereto, and had a threshold current of 35 mA, a slope efficiency of 1.2 W/A and an oscillation wavelength of 405 nm. Its current-optical output characteristic had a kink level of 100 mW or more. The current-optical output characteristic of Comparative Example No. 1 is shown in FIG. 19.

It can be seen from this result that the laser diode of this Comparative Example No. 1 operates in a stabilized horizontal transverse mode even if its optical output should be as high as about 100 mW. This means that the transverse mode is controlled sufficiently by adjusting the overall thickness of the remaining portions of the p-type semiconductor layers by a dry etching process. When its far field pattern (FFP) was evaluated, θ// was 9 degrees, θ⊥ was 22 degrees, and the aspect ratio (θ⊥/θ//) was 2.4. A semiconductor laser diode for optical disks needs to have an aspect ratio of less than 3. Thus, Comparative Example No. 1 meets this requirement. Next, the laser diode was subjected to an APC life test at room temperature and with the optical output maintained at as high as 30 mW. As a result, Comparative Example No. 1 deteriorated at a rate of about 0.05 mA/h and could operate with good stability for 1,000 hours or more.

These data show that Comparative Example No. 1 had a kink level of 100 mW or more, an aspect ratio of 2.4, and as long a life as 1,000 hours or more and seems to satisfy the requirements for a light source for next-generation high-density high-speed-writing optical disks. However, this Comparative Example No. 1 achieves the current confinement and horizontal transverse mode control by adjusting the dry etching process time and therefore has big problems in reproducibility of the process and laser characteristic and in yield, thus constituting one of factors of soaring costs.

Next, it will be described how difficult it is to control the ridge height according to the manufacturing process of Comparative Example No. 1.

To control the ridge height, control of crystal growth over the entire wafer plane and control of dry etching need to be performed at the same time. In addition, there is no crystal-growing layer that functions as a dry etch stopper layer, and the etch depth must be controlled by adjusting only the etching process time. For these reasons, it is very difficult to control the ridge height.

Hereinafter, examples of semiconductor laser diodes, of which the ridge has been deformed from the ideal shape shown in FIG. 15 due to some variations of the dry etching process, will be described as Comparative Examples Nos. 2 and 3.

Figure 16:
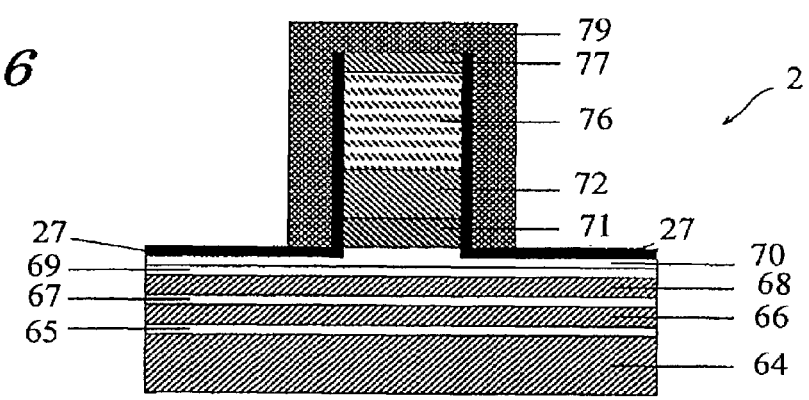
FIG. 16 is a cross-sectional view illustrating the structure of another semiconductor laser as Comparative Example No. 2.
Figure 17:
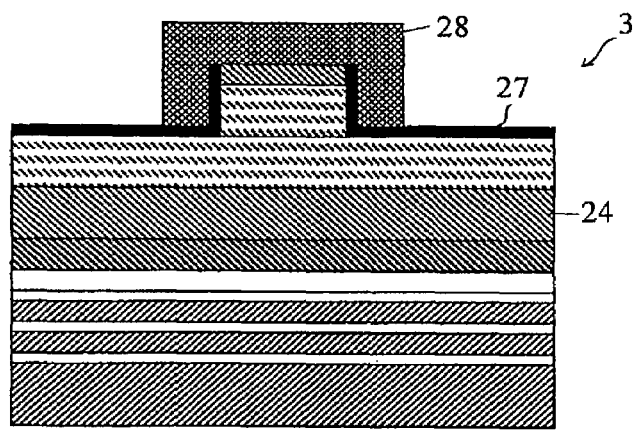
FIG. 17 is a cross-sectional view illustrating the structure of another semiconductor laser as Comparative Example No. 3.

FIG. 16 illustrates what structure a laser diode will have if the dry etching process step happens to be carried out longer than the predetermined amount of time during the ridge forming process. On the other hand, FIG. 17 illustrates what structure a laser diode will have if the dry etching process step happens to be carried out shorter than the predetermined amount of time.

It should be noted that the ridge heights determined by these varied dry etching process times fall within the ridge height distribution range in the wafer plane during the manufacturing process of currently most common GaN based lasers. That is to say, the diode structures shown in FIGS. 16 and 17 are often observed on the production line pf semiconductor lasers.

First, referring to FIG. 16, illustrated is Comparative Example No. 2 in which the combined thickness of the p-type semiconductor regions on the active layer (i.e., the overall thickness of remaining portions of the p-type semiconductors) is smaller than the predetermined value of 140 nm. Meanwhile, in Comparative Example No. 3 shown in FIG. 17, the "overall thickness of remaining portions of the p-type semiconductors" on the active layer is greater than the predetermined value of 140 nm.

Even the elements representing Comparative Examples Nos. 2 and 3 also achieved continuous wave oscillation at room temperature by injecting current thereto. The element of Comparative Example No. 2 had a threshold current of 40 mA and a slope efficiency of 1.0 W/A. On the other hand, the element of Comparative Example No. 3 had a threshold current of 60 mA and a slope efficiency of 0.7 W/A. Compared to the element of Comparative Example No. 1 described above, the element of Comparative Example No. 2 had an increased threshold current and a decreased slope efficiency. This is believed to be because the overall thickness of the remaining portions of the p-type semiconductors produced by the dry etching process was smaller than the predetermined value and etching-induced damage was done on the active layer.

Meanwhile, in the element of Comparative Example No. 3, increase in threshold current and decrease in slope efficiency were both significant. This is because the overall thickness of the remaining portions of the p-type semiconductors was greater than the predetermined value and the amount of ineffective (leakage) current, flowing laterally from the ridge structure while broadly expanding, increased.

Figure 20:
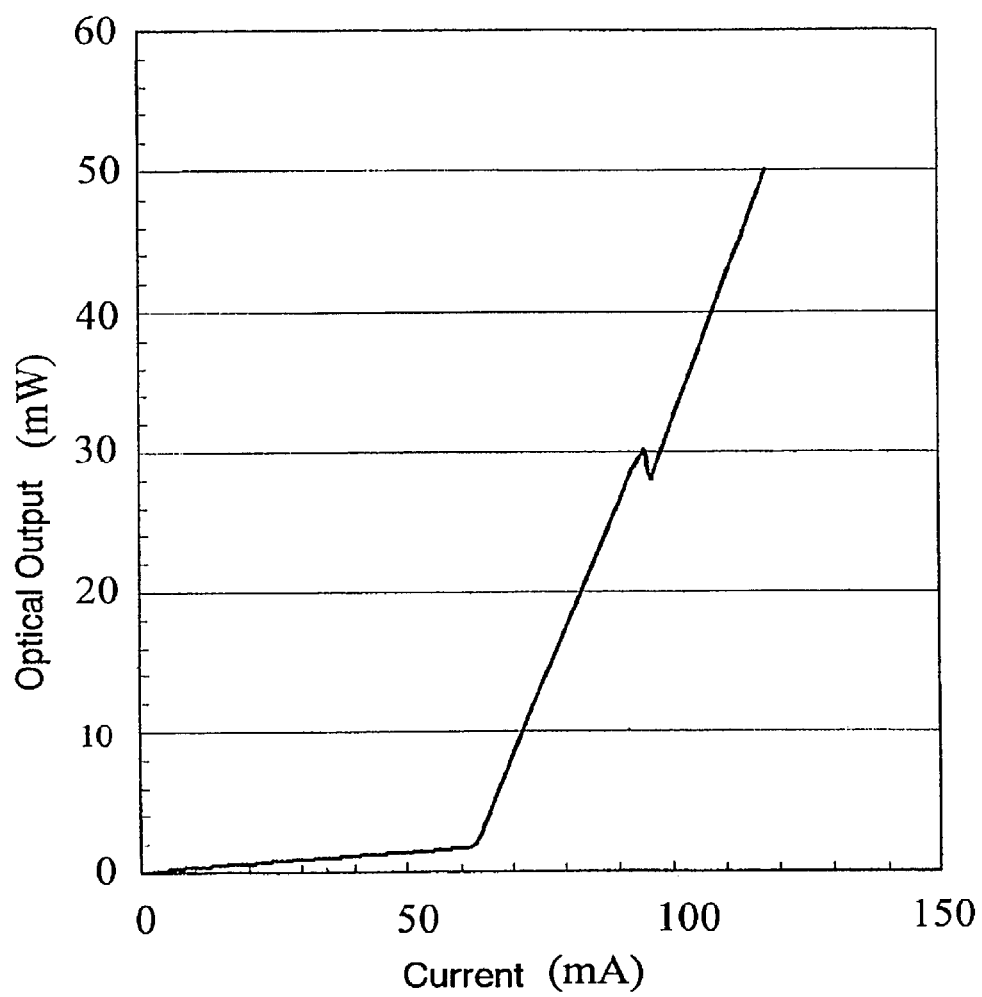
FIG. 20 is a graph showing a current-optical output characteristic in Comparative Example No. 2.

Comparing the kink levels of the current-optical output characteristics, the elements of Comparative Examples Nos. 1 and 3 produced kinks at 100 mW or more, while the element of Comparative Example No. 2 produced a kink at as low a level as 30 mW as shown in FIG. 20. The reason is believed to be as follows. Specifically, in the element of Comparative Example No. 2, the difference Δn in real refractive index between the region right under the ridge and the other regions increased so much as to promote the lateral confinement of light excessively. As a result, the horizontal transverse mode should have lost its stability and the kink level decreased against expectations.

Also, evaluating the FFPs, the element of Comparative Example No. 2 had an aspect ratio of 1.8 (where θ// is 12 degrees and θ⊥ is 22 degrees), while the element of Comparative Example No. 3 had an aspect ratio of 3.7 (where θ// is 6 degrees and θ⊥ is 22 degrees). An element with an aspect ratio of more than 3 such as Comparative Example No. 3 is unsuitable as a light source for an optical disk drive.

Next, these elements were subjected to an APC life test at room temperature and with the optical output maintained at as high as 30 mW. As a result, Comparative Example No. 1 deteriorated at a rate of about 0.05 mA/h and could operate with good stability for 1,000 hours or more. However, since its active layer was damaged due to the dry etching process, the element of Comparative Example No. 2 deteriorated at a rather high rate of about 0.2 mA/h and had a life of approximately 600 hours. Meanwhile, the element of Comparative Example No. 3 required a large operating current and dissipated a lot of power, and therefore, had as short a life as about 300 hours.

As can be seen from these data, a conventional GaN based laser, of which the ridge structure is formed, and the horizontal transverse mode is controlled, by a dry etching technique, has big problems in either in-wafer-plane or process-by-process laser characteristic reproducibility and yield, thus raising the costs unintentionally.

It should be noted that the semiconductor laser according to the preferred embodiment of the present invention shown in FIG. 1 had a kink level of 100 mW or more, an aspect ratio of 2.4 and as long a life as 1,000 hours or more and satisfies the requirements for a light source for next-generation high-density high-speed-writing optical disks just like Comparative Example No. 1.

In addition, the semiconductor laser according to the preferred embodiment described above gets the current confinement and horizontal transverse mode control done just by controlling the crystal-growing processes. Consequently, the problems described for the comparative examples can be mostly overcome and the manufacturing process itself can be significantly simplified and streamlined, thus greatly contributing to achieving high yield and cost reduction.

In the preferred embodiment of the present invention described above, the current confining layer 75 is made of n-$Al_{0.04}Ga_{0.96}N$. However, the refractive index of the current confining layer 75 can be arbitrary changed according to the mixed crystal composition of the crystal-growing films. Thus, in another preferred embodiment of the present invention, either a loss guide structure or a real refractive index guide structure can be easily designed.

On top of that, the semiconductor laser of this preferred embodiment has a real refractive index guide structure. Therefore, it is easier than the semiconductor lasers of the comparative examples to design the outside portions of the active layer such that those portions function as a light absorbing layer in the area where the injected current is confined. Consequently, the relative intensity noise (RIN) can be reduced to about −125 dB/Hz or less within an optical output range of 1.5 mW to 100 mW.

The preferred embodiments described above are GaN based semiconductor light-emitting elements. However, the present invention is equally applicable to a light-emitting element made of any other Group III-V compound semiconductor such as gallium arsenide (GaAs) or indium phosphide (InP).

Also, although a sapphire wafer is used in the preferred embodiments described above, the semiconductor wafer of the present invention does not have to be made of sapphire but may also be an SiC wafer or a GaN wafer.

Furthermore, in the preferred embodiment described above, the insulating film 73 is used as a masking layer for selective growth in the process step of forming the current confining layer 75. However, as far as the layer can function as a masking layer, its material does not have to be an insulator.

Furthermore, in the preferred embodiment described above, the insulating film 75 is completely removed before a semiconductor layer is re-grown on the current confining layer 75. However, the insulating film 75 may be partially left under the overhanging portions 75a of the current confining layer 75.

INDUSTRIAL APPLICABILITY

According to the present invention, a semiconductor light-emitting element, operating in a short-wave range of the violet through ultraviolet parts of the spectrum, is provided and may be broadly applicable as a light source for an optical disk drive.

The invention claimed is:

1. A semiconductor light-emitting element comprising:
a first Group III-V compound semiconductor;
a current confining layer, which is made of a second Group III-V compound semiconductor that has grown on a selected surface area of the first Group III-V compound semiconductor and which has a striped opening extending along the length of a resonant cavity; and
a third Group III-V compound semiconductor, which covers the surface of the first Group III-V compound semiconductor that is exposed through the striped opening and the surface of the current confining layer,
wherein the current confining layer has two overhanging portions that overhang toward the striped opening, each of the two overhanging portions being made of a laterally grown layer,
a first gap is provided between each of the two overhanging portions of the current confining layer and a part of the surface of the first Group III-V compound semiconductor, the first gap not being filled by the third Group III-V compound semiconductor, and
wherein a second gap between the two overhanging portions facing each other is defined as W0, and a lateral size of each of the two overhanging portions is defined as W1, such that W0 is 1.5 μm or less and W0+2W1 is 3 μm or more.

2. The semiconductor light-emitting element of claim 1, wherein the first gap has a height of at least 10 nm and a width of at least 0.1 μm.

3. The semiconductor light-emitting element of claim 1, wherein a portion of the third Group III-V compound semiconductor, which contacts with the surface of the first Group III-V compound semiconductor through the striped opening, has a width of 0.5 μm to 3 μm.

4. The semiconductor light-emitting element of claim 1, wherein the first Group III-V compound semiconductor has a multilayer structure including an active layer.

5. The semiconductor light-emitting element of claim 1, wherein the Group III-V compound semiconductors are gallium nitride based.

6. The semiconductor light-emitting element of claim 5, wherein the current confining layer includes a gallium nitride layer with aluminum, and
wherein the current confining layer has a thickness of 0.1 μm to 0.5 μm.

7. The semiconductor light-emitting element of claim 1, wherein the electrical conductivity type of the second Group III-V compound semiconductor is opposite to that of the first Group III-V compound semiconductor.

8. The semiconductor light-emitting element of claim 7, wherein the electrical conductivity type of the second Group III-V compound semiconductor is n-type.

9. The semiconductor light-emitting element of claim 1, wherein the electrical conductivity type of the third Group III-V compound semiconductor is the same as that of the first Group III-V compound semiconductor.

* * * * *

UNITED STATES PATENT AND TRADEMARK OFFICE
CERTIFICATE OF CORRECTION

PATENT NO. : 7,622,749 B2
APPLICATION NO. : 11/972844
DATED : November 24, 2009
INVENTOR(S) : Yoshiaki Hasegawa, Toshiya Yokogawa and Atsushi Yamada It is certified that error appears in the above-identified patent and that said Letters Patent is hereby corrected as shown below:

Title Page, the following should appear:
   (30) Foreign Application Priority Data
      Apr. 28, 2003    (JP) 2003-124044

Title Page, Item (63), after "now Pat. No. 7,396,697", insert -- which was filed as 371 of international application No. PCT/JP2004/004974 on Apr. 6, 2004 --.

Signed and Sealed this

Ninth Day of March, 2010

David J. Kappos
*Director of the United States Patent and Trademark Office*